(12) United States Patent
Lindström

(10) Patent No.: US 8,058,090 B2
(45) Date of Patent: Nov. 15, 2011

(54) APPARATUS AND METHOD OF MANUFACTURING SOLAR CELLS

(75) Inventor: Sven Lindström, Bandhagen (SE)

(73) Assignee: Midsummer AB, Kista (SE)

( * ) Notice: Subject to any disclaimer, the term of this patent is extended or adjusted under 35 U.S.C. 154(b) by 331 days.

(21) Appl. No.: 11/664,982

(22) PCT Filed: Oct. 6, 2005

(86) PCT No.: PCT/SE2005/001476
§ 371 (c)(1),
(2), (4) Date: Apr. 9, 2007

(87) PCT Pub. No.: WO2006/038875
PCT Pub. Date: Apr. 13, 2006

(65) Prior Publication Data
US 2009/0011535 A1 Jan. 8, 2009

(51) Int. Cl.
*H01L 21/00* (2006.01)
(52) U.S. Cl. ............. 438/57; 438/73; 438/94; 438/166; 257/E21.125; 257/E21.134; 257/E21.413
(58) Field of Classification Search .............. 438/57, 438/73, 94, 166; 257/E21.134, E21.413
See application file for complete search history.

(56) References Cited

U.S. PATENT DOCUMENTS

| 4,824,489 A | 4/1989 | Cogan et al. | |
| 5,008,176 A * | 4/1991 | Kondo et al. | 430/270.11 |
| 5,244,509 A * | 9/1993 | Arao et al. | 136/259 |
| 5,456,763 A | 10/1995 | Kaschmitter et al. | |
| 5,714,404 A | 2/1998 | Mitlitsky et al. | |
| 6,235,110 B1 * | 5/2001 | Naomoto et al. | 117/204 |
| 6,258,620 B1 | 7/2001 | Morel et al. | |
| 2004/0266080 A1 * | 12/2004 | Jyumonji et al. | 438/166 |
| 2005/0072461 A1 * | 4/2005 | Kuchinski et al. | 136/256 |
| 2005/0186342 A1 * | 8/2005 | Sager et al. | 427/248.1 |

FOREIGN PATENT DOCUMENTS

| JP | 11 074206 | | 3/1999 |
| JP | 204193490 | A | 12/2003 |
| JP | 2002362381 | A | 12/2003 |
| JP | 2004 063924 | A | 2/2004 |
| JP | 2004193490 | A * | 7/2004 |
| WO | WO 02/41363 | A2 | 5/2002 |

OTHER PUBLICATIONS

Extended European Patent Office Search Report, dated Feb. 16, 2009, issued in connection with counterpart EP Application No. 05 789 660.7.

(Continued)

*Primary Examiner* — Charles Garber
*Assistant Examiner* — Abdulfattah Mustapha
(74) *Attorney, Agent, or Firm* — Venable LLP; Eric J. Franklin

(57) ABSTRACT

The present invention relates to the field of thin film solar cells and particularly to an apparatus and method for manufacturing thin film solar cells. At least one material is deposited onto a substrate, whereby the deposited material is heated by means of heating means on a limited area of the deposited material. The substrate and the heating means are continuously moved in relation to each other until a predetermined area of the deposited material is heated, whereby the heated material is cooled in a controlled way, thus, obtaining a desired crystalline structure of the deposited material.

11 Claims, 2 Drawing Sheets

OTHER PUBLICATIONS

PCT/ISA/210—International Search Report.
PCT/ISA/237—Written Opinion of the International Searching Authority.
Olle Lundberg; Band Gap Profiling and High Speed Deposition of Cu(In, Ga)Se$_2$ for Thin Film Solar Cells; Uppsala University Department of Engineering Sciences, 2003.
PCT/IPEA/409—International Preliminary Report on Patentability—Apr. 26, 2007.
PCT/IPEA/416—Notification of Transmittal of the International Preliminary Report on Patentability—Apr. 26, 2007.
Notification of the First Office Action (PCT Application in the National Phase) from the Patent Office of the People's Republic of China), dated Jun. 20, 2008, on Counterpart Chinese Application No. 200580034270.3.

* cited by examiner

APPARATUS AND METHOD OF MANUFACTURING SOLAR CELLS

BACKGROUND OF THE INVENTION

1. Field of the Invention

The present invention relates to the field of manufacturing solar cells, and particularly to an apparatus allowing for manufacturing thin film solar cells as well as a method for such manufacturing.

2. Description of the Related Art

Thin film solar cells are usually manufactured by vacuum evaporation of material onto a glass substrate. The Photovoltaic (PV) materials used could be Cu, In, Ga and Se. (Usually called CIGS, CIGSe or CIGS2). Another type is Cu, In and S. (Usually referred to as CIS). A Third type is using Cu, In, Ga, Se and S. (Usually referred to as CIGSS or CIGSS2). Other type of thin film cells using Si or Cd and Te is also possible. Methods of manufacturing vary, but usually include vacuum co-evaporation and sometimes combined with Selenization at high temperature. Other methods used are Close Space Sublimation (CSS) and sputtering.

To improve the efficiency of the cell the substrate is usually heated during the evaporation process. This enables the evaporated atoms and molecules to easier find their place in the crystal structure that is formed on the substrate. To achieve maximum efficiency of a cell the substrates should be heated to 500-600° C. or above. Soda-lime glass cannot be heated to higher than 600° C. and of course not plastic materials either. One can use other glass types, but the Na-content of the soda-lime glass has a positive effect on the structure formation on the glass. So the problem is that the substrate has to be heated during the deposition and if one uses Soda-lime glass with a high Na content it cannot be heated to the optimal temperature. If other materials are used a Na layer first usually is deposited onto the substrate for best result. The temperatures also exclude the use of plastic materials.

The above mentioned method is e.g. disclosed in "Band Gap Profiling and High Speed Deposition of Cu(InGa)Se2 for Thin Film Solar Cells", Olle Lundberg, Uppsala University, Department of Engineering Sciences, 2003.

U.S. Pat. No. 6,258,620 also describes the above mentioned method, but instead of co-evaporation the CInGa materials are deposited in turn and selenized in a Se flux.

SUMMARY OF THE INVENTION

An object of the present invention is to provide an improved apparatus allowing for manufacturing thin film solar cells.

This object is achieved through providing an apparatus which comprises: means for depositing at least one material onto a substrate; heating means for heating the deposited material on a limited area of the deposited material; means for continuously moving the substrate and the heating means in relation to each other until a predetermined area of the deposited material is heated; means for cooling the heated material in a controlled way; and, means for obtaining a desired crystalline structure of the deposited material.

A further object of the present invention is to provide an improved method for manufacturing thin film solar cells.

This further object is achieved through providing a method comprising the steps of: depositing at least one material onto a substrate; heating the deposited material by means of heating means on a limited area of the deposited material; continuously moving the substrate and the heating means in relation to each other until a predetermined area of the deposited material is heated; cooling the heated material in a controlled way; and, obtaining a desired crystalline structure of the deposited material.

Still other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

The present invention concerns thin film solar cells, which comprise a substrate with a deposited absorbance material. The absorbance material is deposited on the substrate in a known manner, such as sputtering and/or vacuum evaporation.

The preferred material for absorbance layer in this invention is CIGS which consist of Cu, In, Ga and Se and/or S. These materials can be deposited together or sequentially in many combinations. But the inventive method may be used on any thin film solar cell.

The invention has the particular advantage over prior art that the substrate temperature absorbance is limited during the process due to that only a limited area of the absorbance material is heated and therefore many different substrate materials such as plastic-, metal- and glass-materials can be used.

Another advantage over prior art is that the deposition of the materials can be done without heating the substrate during deposition. Instead the formation of crystals are improved after the absorbance layer has been deposited.

The substrate has in the preferred embodiment a circular form, which enables the use of equipment already used in optical storage media manufacturing industry, but the invention may be used on substrates having any form.

Figure 1:
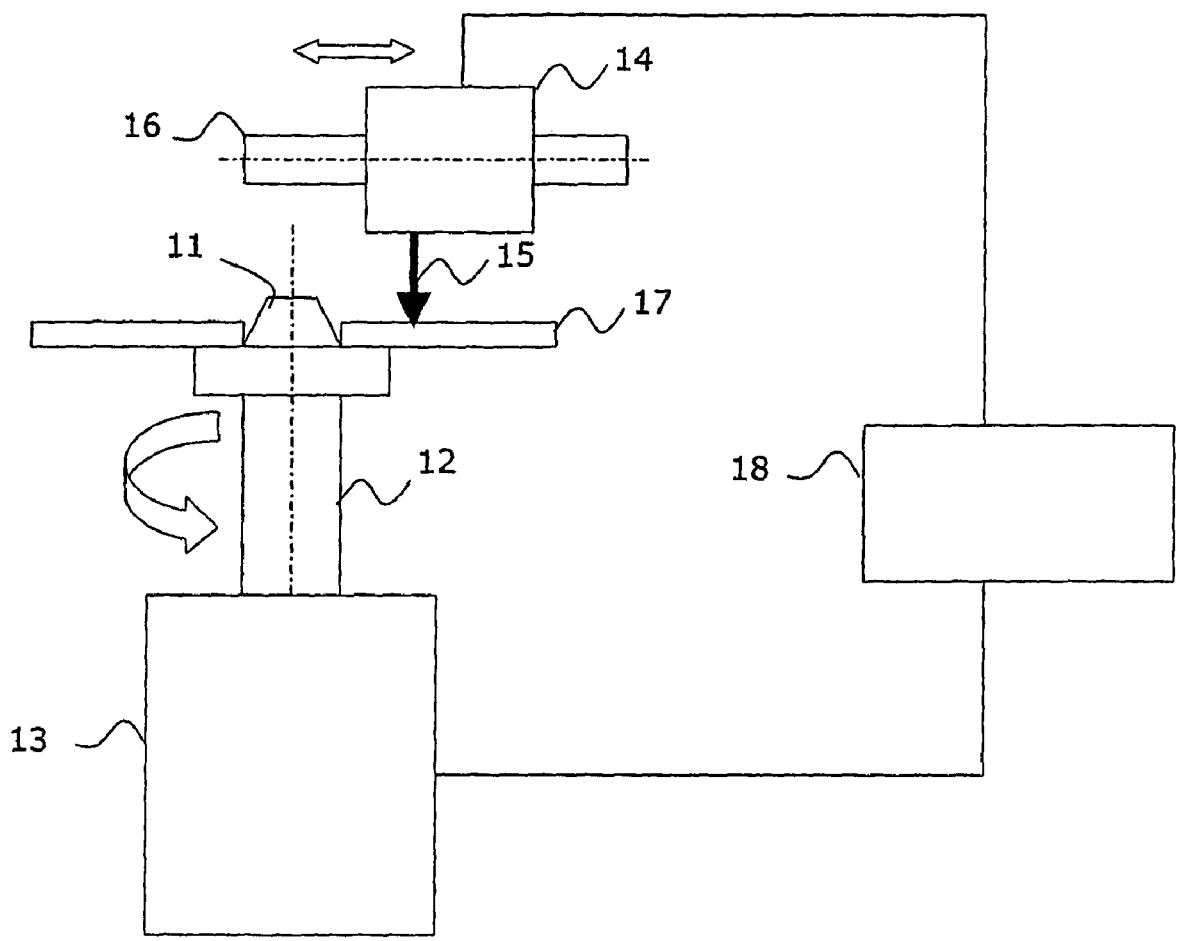
FIG. 1 illustrates an apparatus with a rotating substrate and a laser beam with control function to heat a thin film solar cell according to a preferred embodiment of the present invention.

In the following a preferred embodiment of an apparatus 10 for manufacturing a thin film solar cell will be described in conjunction with FIG. 1. The term substrate means in the description below a substrate with a deposited absorbance layer.

The apparatus 10 comprises a chuck 11 arranged to receive a substrate 17 and to rotate the substrate 17 in a substantially horizontal position. The chuck 11 is arranged on a substantially vertical axis 12 and rotated by driving means 13, such as a motor.

The apparatus 10 further comprises a laser 14 sending a laser beam 15 against the substrate 17. The laser beam 15 is arranged to heat the absorbance material on the substrate 17, which is described more in detail further below and in conjunction with FIGS. 2a and 2b. In the preferred embodiment of the present invention a laser 14 is used to heat the absorbance material, but the person skilled in the art realizes that any heating means capable of heating a material on a limited area may be used, such as an inductive heating arrangement or an electronic beam. Also, the preferred embodiment uses one laser beam, but the skilled person realizes that more than one laser beam of course may be used.

The laser 14 is arranged on a substantially horizontal axis 16 and is arranged to move along the axis 16 (shown with an arrow) when heating the absorbance material. The laser beam 15 is heating the absorbance material on a small limited area (a spot). The substrate 17 is continuously rotated by the chuck 11 and the laser 14 is continuously moved along the axis 16. Thus, the absorbance material is continuously heated in a helical pattern until the whole area or a predetermined area of the absorbance material is heated.

The crystallization is controlled by a unit 18 controlling the effect of the heating and the cooling time to obtain a desired crystalline structure of the absorbance material. The effect of heating is controlled by e.g. laser power, rotating speed of the chuck, horizontal movement of the laser and/or the focus of the laser beam. The cooling time is also controlled e.g. by laser power, rotating speed of the chuck, horizontal movement of the laser and/or the focus of the laser beam.

Figure 2A:
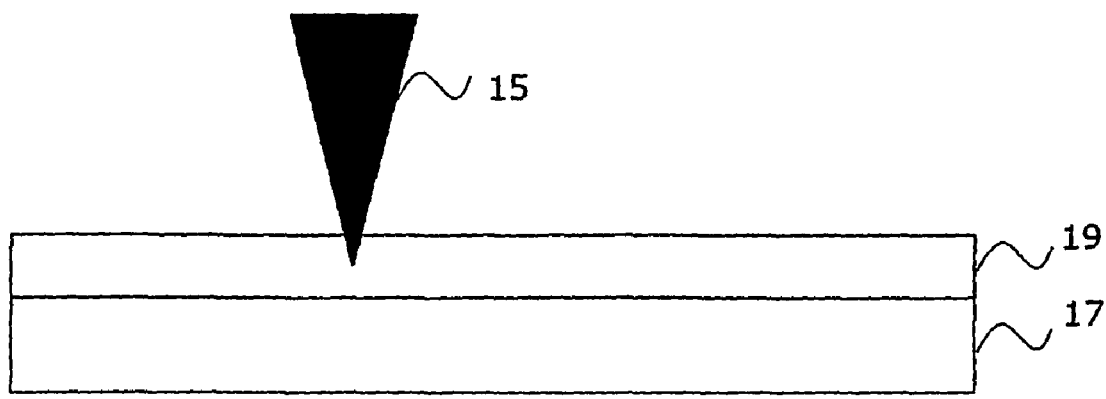
FIG. 2a illustrates a laser beam focused on one limited area on an absorbance layer of a thin film solar cell.
Figure 2B:
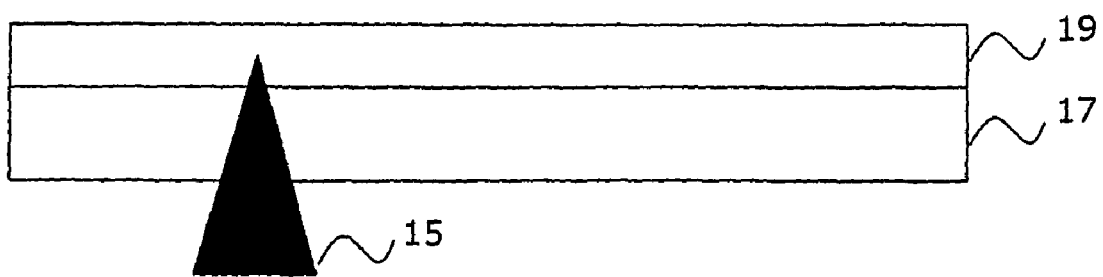
FIG. 2b illustrates a laser beam focused on one limited area through the substrate on an absorbance layer of a thin film solar cell.

As can be seen from FIGS. 2a and 2b, the laser beam 15 may heat the absorbance material/layer 19 either from above or through the substrate 17. The choice of direction from which the absorbance layer 19 is heated depends on e.g. in what order the different layers are deposited. The choice of direction also depends if other layers such as heat sink layers is used and where they are placed in the stack of layers.

In the following will be described a method for manufacturing a thin film solar cell comprising the steps of: depositing at least one material onto a substrate; heating the deposited material by means of heating means on a limited area of the deposited material; moving the substrate and the heating means in relation to each other until a predetermined area of the deposited material is heated; cooling the heated material in a controlled way; and, obtaining a desired crystalline structure of the deposited material.

As illustrated by the above, a thin film solar cell manufacturing apparatus and a method for manufacturing a thin film solar cell has been described, where a deposited substrate is heated in a small limited area in order to achieve a desired crystalline structure. The approach according to the present invention being advantageous in comparison to the previously discussed prior art approach, which requires deposition of the absorbance layer on a heated substrate to achieve the desired crystalline structure. Also, the method of heating only a small limited area at a time enables the use of substrates sensitive to high temperatures. Further, the inventive method enables good results with any deposition method. The above described advantages substantially lower the cost of manufacturing thin film solar cells.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for manufacturing a thin film solar cell, the method comprising:
   depositing at least one absorbance material onto a substrate without heating the substrate;
   heating the deposited absorbance material with a laser producing a laser beam directed to the substrate, the laser beam heating a limited area of the deposited absorbance material;
   continuously rotating the substrate and continuously moving the laser along an axis such that the deposited absorbance material is continuously heated by the laser in a helical pattern until a predetermined area of the deposited absorbance material is heated;
   cooling the heated material in a controlled way; and
   obtaining a desired crystalline structure of the deposited absorbance material.

2. The method according to claim 1, wherein the crystalline structure of the deposited absorbance material is controlled by the effect of the heating.

3. The method according to claim 1, wherein the crystalline structure of the deposited absorbance material is controlled by the cooling time.

4. The method according to claim 1, wherein the crystalline structure of the deposited absorbance material is controlled by the relative movement of the substrate and the laser.

5. The method according to claim 1, wherein the substrate comprises a plastic material.

6. The method according to claim 1, wherein the deposition of the at least one absorbance material is done on a cold substrate.

7. The method according to claim 1, wherein the solar cells are CIGS solar cells.

8. An apparatus for manufacturing a thin film solar cell, the apparatus comprising:
   a deposition module configured to deposit at least one absorbance material onto a substrate without heating the substrate;
   a laser arranged to heat the deposited absorbance material by directing a laser beam toward the substrate, whereby the laser beam is arranged to heat a limited area of the deposited absorbance material;
   a rotation module configured to continuously rotate the substrate and continuously moving the laser along an axis such that the deposited absorbance material is continuously heated by the laser beam in a helical pattern until a predetermined area of the deposited absorbance material is heated;
   a temperature control module configured to cool the heated material in a controlled way; and
   a control module configured to obtain a desired crystalline structure of the deposited absorbance material.

9. The apparatus according to claim 8, wherein the effect of the heating is arranged to control the crystalline structure of the deposited absorbance material.

10. The apparatus according to claim 8, wherein the cooling time is arranged to control the crystalline structure of the deposited absorbance material.

11. The apparatus according to claim 8, wherein the relative movement of the substrate and the laser is arranged to control the crystalline structure of the deposited absorbance material.

* * * * *

UNITED STATES PATENT AND TRADEMARK OFFICE
CERTIFICATE OF CORRECTION

| | | |
|---|---|---|
| PATENT NO. | : 8,058,090 B2 | Page 1 of 1 |
| APPLICATION NO. | : 11/664982 | |
| DATED | : November 15, 2011 | |
| INVENTOR(S) | : Sven Lindström | |

It is certified that error appears in the above-identified patent and that said Letters Patent is hereby corrected as shown below:

On the Title Page Item (30)
Please include the following priority history on the face of the patent:

--SE Patent Application No. 0402432-9, Filed October 8, 2004--.

Signed and Sealed this
Tenth Day of April, 2012

David J. Kappos
*Director of the United States Patent and Trademark Office*